US010082850B2

(12) United States Patent
Shirakami et al.

(10) Patent No.: US 10,082,850 B2
(45) Date of Patent: Sep. 25, 2018

(54) ELECTRONIC DEVICE

(71) Applicant: FUJITSU LIMITED, Kawasaki-shi, Kanagawa (JP)

(72) Inventors: Takashi Shirakami, Kawasaki (JP); Hideaki Matsumoto, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/621,333

(22) Filed: Jun. 13, 2017

(65) Prior Publication Data
US 2018/0011522 A1    Jan. 11, 2018

(30) Foreign Application Priority Data

Jul. 6, 2016   (JP) .................................. 2016-134219

(51) Int. Cl.
*G06F 1/20*   (2006.01)
*H05K 7/20*   (2006.01)

(52) U.S. Cl.
CPC ......... *G06F 1/206* (2013.01); *H05K 7/20209* (2013.01); *H05K 7/20727* (2013.01); *H05K 7/20754* (2013.01); *H05K 7/20836* (2013.01)

(58) Field of Classification Search
CPC ....... H05K 7/20145; H05K 7/20554–7/20572; H05K 7/20718–7/20736; H05K 7/20171; H05K 7/20209; H05K 7/20727; H05K 7/20754; H05K 7/20836; G06F 1/20; G06F 1/206; H01H 37/50
USPC .............. 361/679.48–679.52, 695, 726–727; 454/184; 312/236; 165/80.1–80.3; 337/409
See application file for complete search history.

(56) References Cited

U.S. PATENT DOCUMENTS

| | | | | |
|---|---|---|---|---|
| 5,946,191 A |  | 8/1999 | Oyamada | |
| 5,982,616 A | * | 11/1999 | Moore | G06F 1/20 165/104.33 |
| 6,298,906 B1 | * | 10/2001 | Vize | B60K 11/04 165/122 |

(Continued)

FOREIGN PATENT DOCUMENTS

| | | |
|---|---|---|
| JP | 10-270884 | 10/1998 |
| JP | 2012-9592 | 1/2012 |

OTHER PUBLICATIONS

Espacenet Bibliographic data, Japanese Publication No. 2012-9592, published Jan. 12, 2012.

(Continued)

*Primary Examiner* — Dion R Ferguson
*Assistant Examiner* — Amir Jalali
(74) *Attorney, Agent, or Firm* — Staas & Halsey LLP

(57) ABSTRACT

An electronic device is disclosed. The electronic device includes a chassis and at least one plugin unit mounted in the chassis. The plugin unit includes a substrate, a heat receiving member, a radiator, and a heat transfer member. The substrate mounts a first electronic component and a second electronic component having a higher heat release value than the first electronic component. The heat receiving member receives heat by contacting the second electronic component. The radiator is shaped as a duct. The heat transfer member transfers the heat from the heat receiving member to the radiator. The chassis includes a fan that generates air-current inside the radiator and on one or more component mounting surfaces of the substrate.

11 Claims, 20 Drawing Sheets

(56) References Cited

U.S. PATENT DOCUMENTS

| | | | |
|---|---|---|---|
| 6,353,536 B1* | 3/2002 | Nakamura | G06F 1/1632 |
| | | | 361/679.41 |
| 8,456,839 B2 | 6/2013 | Shirakami et al. | |
| 9,470,441 B2* | 10/2016 | Takubo | F25B 29/00 |
| 9,706,690 B2* | 7/2017 | Liu | H05K 7/20909 |
| 9,802,426 B2* | 10/2017 | Onuma | B41J 11/0085 |
| 2004/0085731 A1* | 5/2004 | Lo | G06F 1/20 |
| | | | 361/695 |
| 2006/0164808 A1* | 7/2006 | Stefanoski | G06F 1/20 |
| | | | 361/700 |
| 2007/0177350 A1* | 8/2007 | Hata | G06F 1/203 |
| | | | 361/697 |
| 2007/0181287 A1* | 8/2007 | Peng | H01L 23/3672 |
| | | | 165/80.3 |
| 2007/0211432 A1* | 9/2007 | Peng | G06F 1/20 |
| | | | 361/700 |
| 2007/0217156 A1* | 9/2007 | Wu | G06F 1/20 |
| | | | 361/700 |
| 2008/0266786 A1* | 10/2008 | Jafari | H01L 23/42 |
| | | | 361/688 |
| 2009/0260777 A1* | 10/2009 | Attlesey | G06F 1/20 |
| | | | 165/67 |
| 2010/0296239 A1* | 11/2010 | Alyaser | F28D 15/00 |
| | | | 361/679.53 |
| 2012/0069521 A1* | 3/2012 | Hwang | F28D 15/0233 |
| | | | 361/697 |
| 2012/0162913 A1* | 6/2012 | Lai | H05K 7/20145 |
| | | | 361/695 |
| 2013/0120935 A1* | 5/2013 | Huang | G06F 1/20 |
| | | | 361/695 |
| 2014/0098489 A1* | 4/2014 | Chiriac | G06F 1/203 |
| | | | 361/679.54 |
| 2014/0362525 A1* | 12/2014 | Zhou | G06F 1/20 |
| | | | 361/679.47 |
| 2016/0357232 A1* | 12/2016 | Kalyanasundaram | G06F 1/206 |

OTHER PUBLICATIONS

Espacenet Bibliographic data, Japanese Publication No. 10-270884, published Oct. 9, 1998.

* cited by examiner

ELECTRONIC DEVICE

CROSS-REFERENCE TO RELATED APPLICATIONS

This application is based upon and claims the benefit of priority of the prior Japanese Patent Application No. 2016-134219, filed on Jul. 6, 2016, the entire contents of which are incorporated herein by reference.

FIELD

The embodiments discussed herein are related to an electronic device.

BACKGROUND

An electronic device having a chassis accommodating multiple plugin units has been known. Each of the multiple plugin units includes a substrate on which multiple electronic components, is connected to a back wiring board mounted inside the chassis.

In such an electronic device, a fan unit mounted in the chassis may send air to each of the plugin units, so that the multiple electronic components mounted on the substrate may be cooled (refer to Patent Document 1).

Patent Document

Patent Document 1

Japanese Laid-open Patent Publication No. 2012-9592

SUMMARY

According to one aspect of the embodiments, an electronic device includes a chassis; and at least one plugin unit mounted in the chassis, wherein the plugin unit includes a substrate that mounts a first electronic component and a second electronic component having a higher heat release value than the first electronic component; a heat receiving member that receives heat by contacting the second electronic component; a radiator that is shaped as a duct; and a heat transfer member that transfers the heat from the heat receiving member to the radiator, and
wherein the chassis includes
a fan that generates air-current inside the radiator and on one or more component mounting surfaces of the substrate; and a heat transfer member that transfers the heat from the heat receiving member to the radiator, and wherein the chassis includes a fan that generates air-current inside the radiator and on one or more component mounting surfaces of the substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In recent years, a plurality of electronic components having significantly different heat release values have been mounted within one unit. The above described related art merely cools the electronic components by blowing. Thus, it is difficult to effectively cool the plurality of the electronic components, of which the heat release values are significantly different.

Accordingly, an electronic device for effectively cooling the plurality of the electronic components having different heat release values will be described below.

Preferred embodiments of the present invention will be described with reference to the accompanying drawings.

First Embodiment

Figure 1:
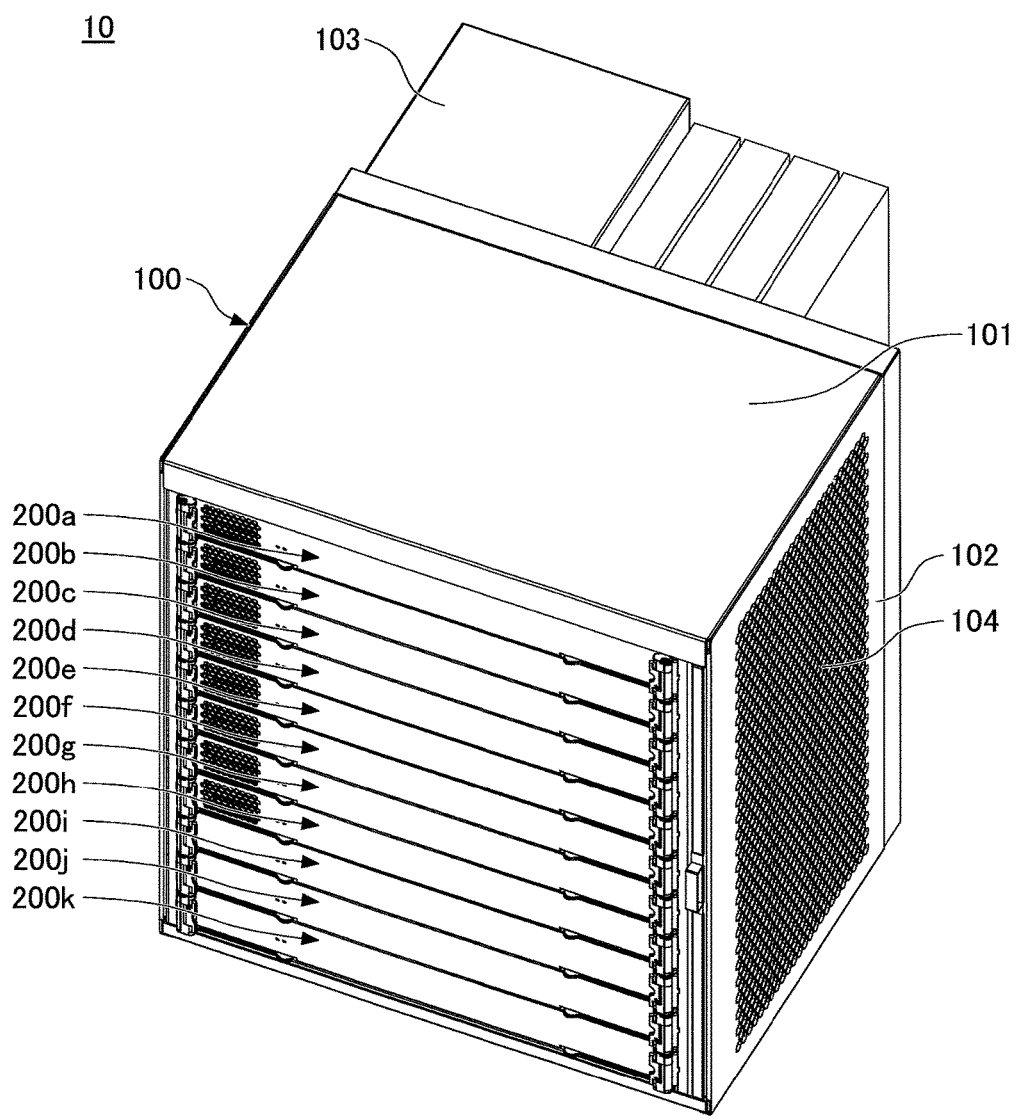
FIG. 1 is a perspective view of an electronic device in a first embodiment.

FIG. 1 is a perspective view of an electronic device 10 in a first embodiment. In addition, FIG. 2 is a perspective view of the electronic device 10, from which a top board 101, a side plate 102, and a fan cover 103 of a chassis 100 depicted in FIG. 1 are removed.

Figure 2:
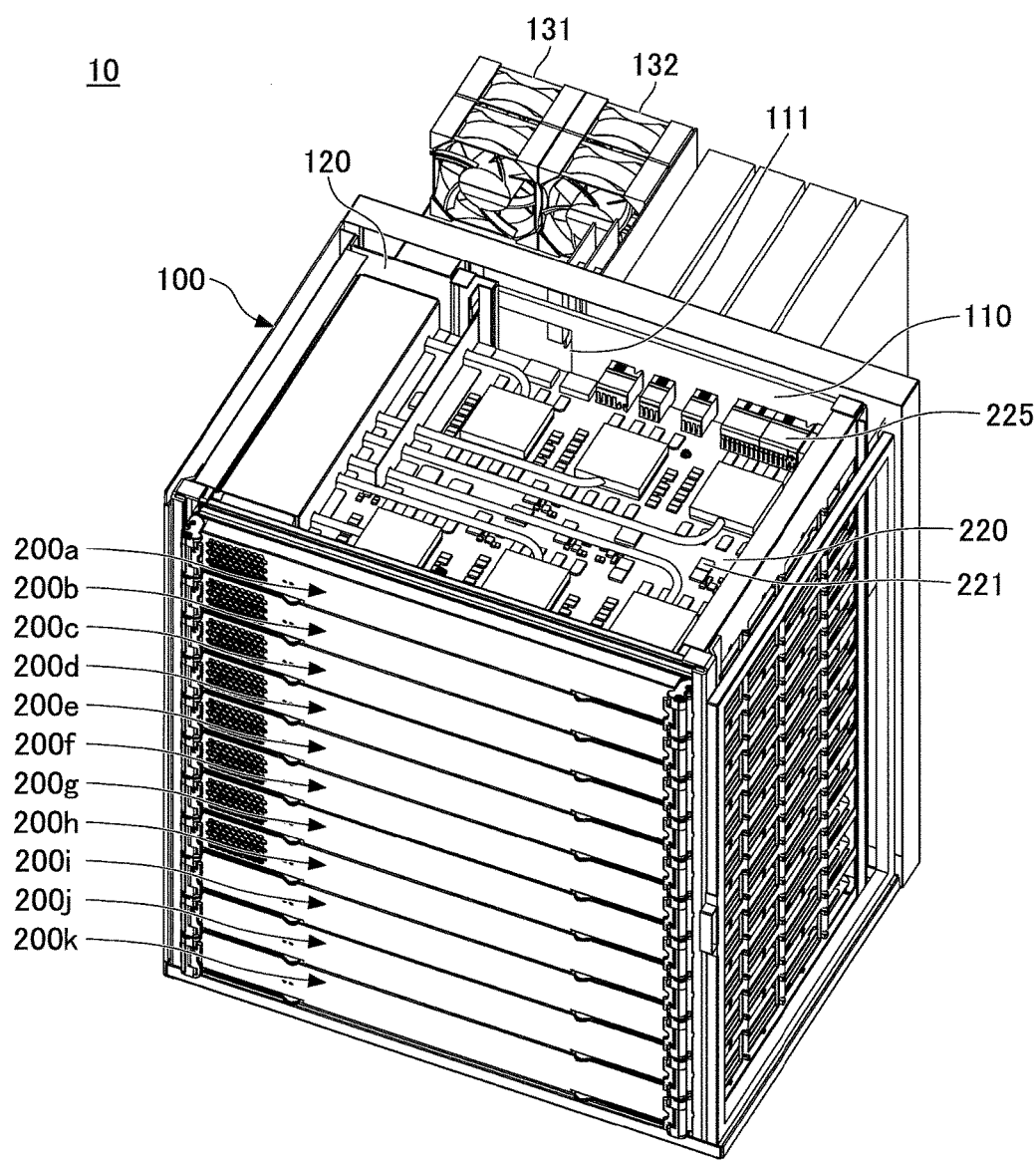
FIG. 2 is a perspective view of the electronic device, from which a top board, a side plate, and a fan cover are removed.

As illustrated in FIG. 1 and FIG. 2, the electronic device 10 includes the chassis 100 mounting a plurality of plugin units 200a, 200b, 200c, 200d, 200e, 200f, 200h, 200i, 200j, and 200k. It is noted that a number of plugin units mounted in the chassis 100 is not limited to the number illustrated in the first embodiment.

The chassis 100 includes a plurality of slots, into which the plugin units 200a to 200k are inserted. The plugin units 200a to 200k are mounted to the chassis 100 by inserting these into slots from a front face in FIG. 1 and FIG. 2. As depicted in FIG. 1, a plurality of inlets 104 are provided to the side plate 102 as illustrated in FIG. 1.

As depicted in FIG. 2, the chassis 100 includes a back wiring board 110, an inner plate 120, a first fan unit 131, and a second fan unit 132.

As depicted in FIG. 2, a connector 225 is provided onto a substrate 220 of the plugin unit 200a and connected to the back wiring board 110. Moreover, connectors provided on respective substrates of the plugin units 200b to 200k are connected to the back wiring board 110. A back wiring board 110 includes a ventilation opening 111 formed on a portion facing the second fan unit 132.

The inner plate 120 is regarded as a plate member, on which an opening is formed for a radiator of the plugin unit 200a to be inserted. The inner plate 120 is provided so as to be bridged between the back wiring board 110 and a side plate of the chassis 100.

The first fan unit 131 and the second fan unit 132 form a flow of the air to generate air-current through the inside of the chassis 100, so as to take outside air from the inlets 104 of the side plate 102, to pass through inside of the plugin unit 200a, and to exhaust the outside air at a backside.

Next, the plugin unit 200a mounted in the chassis 100 will be described.

As illustrated in FIG. 2, the plugin unit 200a includes the substrate 220, on which a plurality of electronic components 221 is mounted. On the substrate 220, a connector 225 is provided to be connected to the back wiring board 110 of the chassis 100.

Figure 3:
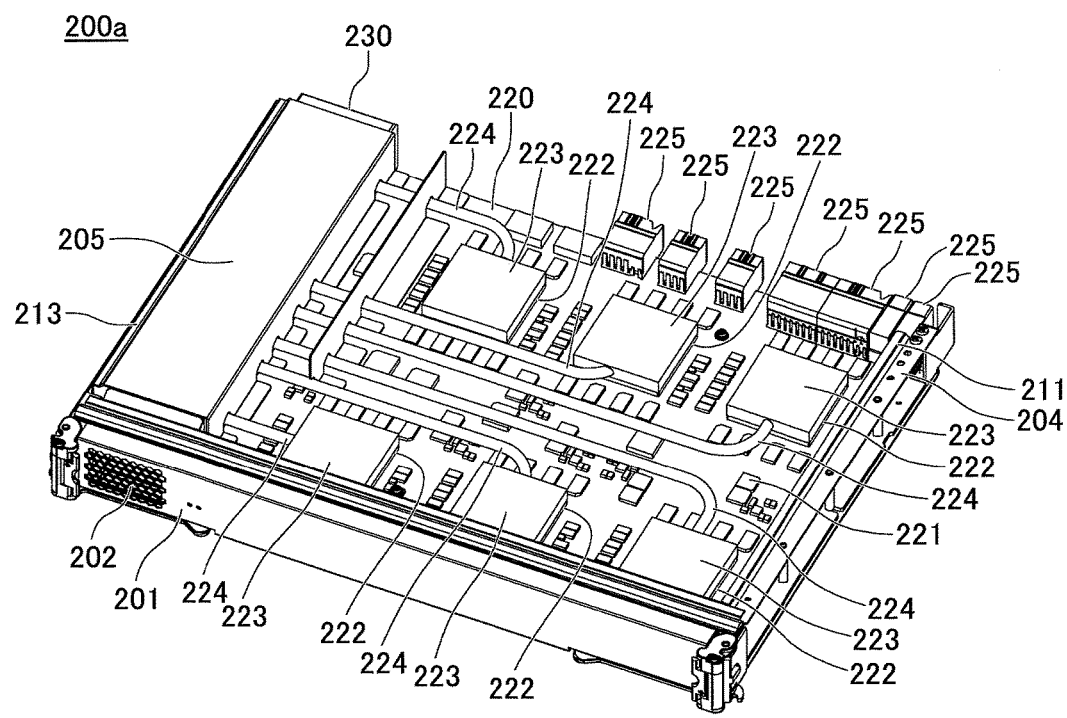
FIG. 3 is a perspective view from a front side of a plugin unit in the first embodiment.
Figure 4:
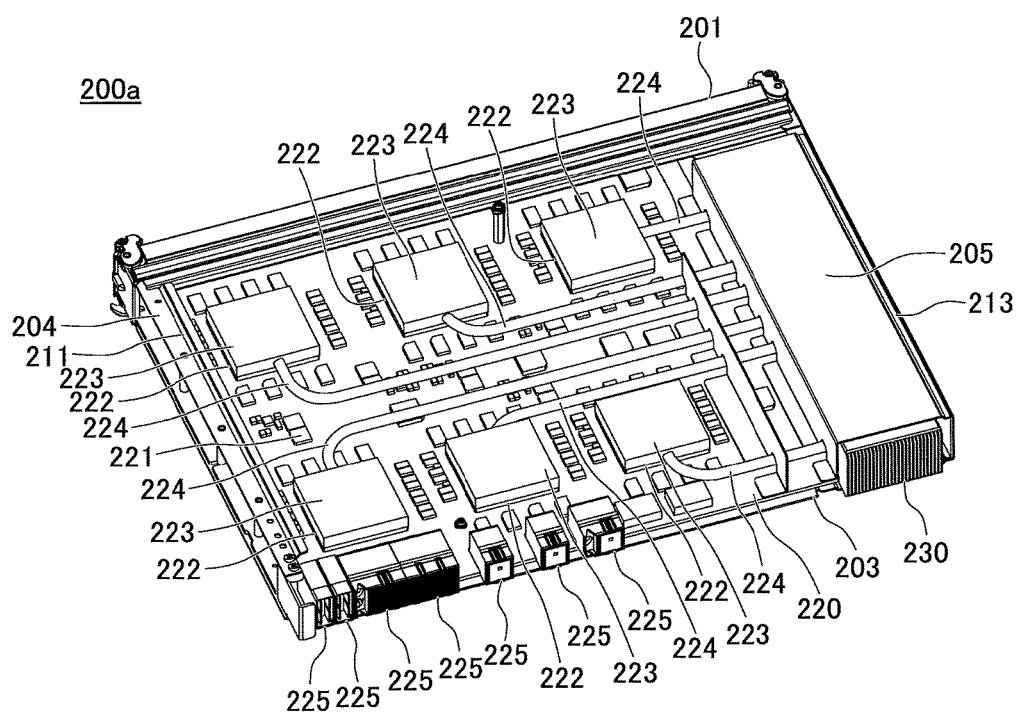
FIG. 4 is a perspective view from a back side of the plugin unit in the first embodiment.

FIG. 3 is a perspective view from a front side (a side of a front panel 201) of the plugin unit 200a in the first embodiment. FIG. 4 is a perspective view from a back side (a side of the connector 225) of the plugin unit 200a. Also, FIG. 5 depicts an exploded perspective view of the plugin unit 200a.

Figure 5:
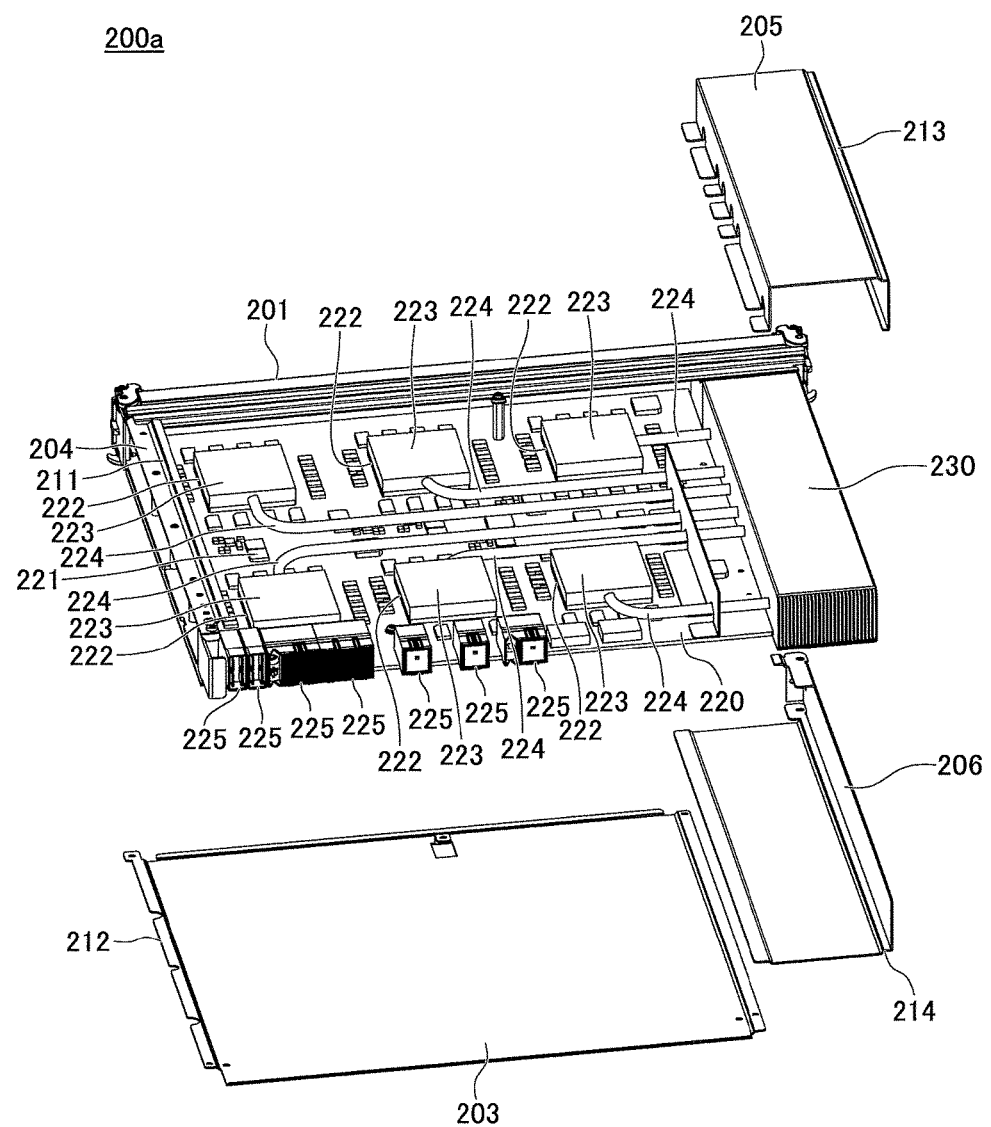
FIG. 5 is an exploded perspective view of the plugin unit in the first embodiment.

As depicted in FIG. 3 through FIG. 5, the plugin unit 200a includes a front panel 201, a side guide 204, a bottom plate 203, an upper cover 205, a lower cover 206, the substrate 220, and a radiator 230. The front panel 201, the bottom plate 203, the upper cover 205, and the lower cover 206 may be formed by a metal material such as a magnesium alloy or the like, or a resin material such as an ABS resin or the like.

As depicted in FIG. 3, on the front panel 201, an air supply cover 202 is formed at a portion facing the radiator 230, and covers the front of the plugin unit 200a. The air supply cover 202 has a plurality of inlets. The side guide 204 includes a guide 211, which is bent so as to run along a rail provided on the slot of the chassis 100. The side guide 204 is fixed to a side edge of the front panel 201 and a lateral edge 212 of the bottom plate 203.

An upper surface of the bottom plate 203 is fixed to the substrate 220. The lateral edge 212 of the bottom plate 203, on the side of the side guide 204, is bent so as to run along the rail provided on the slot of the chassis 100.

The upper cover 205 is mounted on the substrate 220 and the lower cover 206, and covers an upper side of the radiator 230. On a lateral edge of the upper cover 205, an upper guide 213 is formed to run along a rail provided on the slot of the chassis 100.

The lower cover 206 covers a bottom surface side of the radiator 230 fixed on the front panel 201 and the bottom plate 203. On a lateral edge of the lower cover 206, a lower guide groove 214 is formed to run along the rail provided on the slot of the chassis 100.

The guide 211 of the side guide 204, the lateral edge 212 of the bottom plate 203, the upper guide 213, and the lower guide groove 214 are fit for the rails provided on the slot of the chassis 100, so as to guide the plugin unit 200 inserted into the chassis 100.

The substrate 220, on which the plurality of the electronic components 221 are mounted, is fixed on the upper surface of the bottom plate 203. Moreover, on the substrate 220, an electronic component 222 is mounted. The electronic component 222 consumes power greater than other electronic components 221 and has a higher heat release value than the other electronic components 221. Furthermore, on the substrate 220, the connector 225 is provided to connect to the back wiring board 110 of the chassis 100.

On an upper surface of the electronic component 222 having the high heat release value, a heat receiving member 223 is arranged to receive heat generated by the electronic component 222. The heat receiving member 223 may be a plate member formed by the metal material such as aluminum or the like, and is mechanically fixed to the upper surface of the electronic component 222, the substrate 220, or the like. The heat, which the heat receiving member 223 receives from the electronic component 222, is transmitted to the radiator 230 via a heat pipe 224 as a heat transfer member.

An edge of the heat pipe 224 is coupled to the heat receiving member 223, and another edge is coupled to the radiator 230. The heat pipe 224 transmits the heat, which the heat receiving member 223 receives from the electronic component 222, to the radiator 230. At least one portion of the heat pipe 224 is formed by an elastic material, and is enabled to support variation from the radiator 230. It is noted that the heat transfer member is preferably a member transferring the heat from the heat receiving member 223 to the radiator 230, and may be a rod member or the like formed by a metal material having a high thermal conductivity. Hence, the heat transfer member is not limited to the heat pipe 224.

The radiator 230 may have an external form of a duct made by a metal material such as aluminum or the like. The external form may be tubular shape or the like. When the plugin unit 200a is mounted to the chassis 100, and the first fan unit 131 and the second fan unit 132 provided in the chassis 100 are driven, the air flows into the inside of the radiator 230 from the air supply cover 202.

The air flowed to the radiator 230 passes the radiator 230 and is exhausted outside the chassis 100 from the first fan unit 131 and the second fan unit 132. As described above, the first fan unit 131 and the second fan unit 132 form the flow of the air inside the radiator 230 and generate the air-current. Accordingly, the heat, which is transferred to the radiator 230 through the heat receiving member 223 and the heat pipe 224, is exhausted outside the chassis 100, and the electronic component 222 is cooled.

Figure 6:
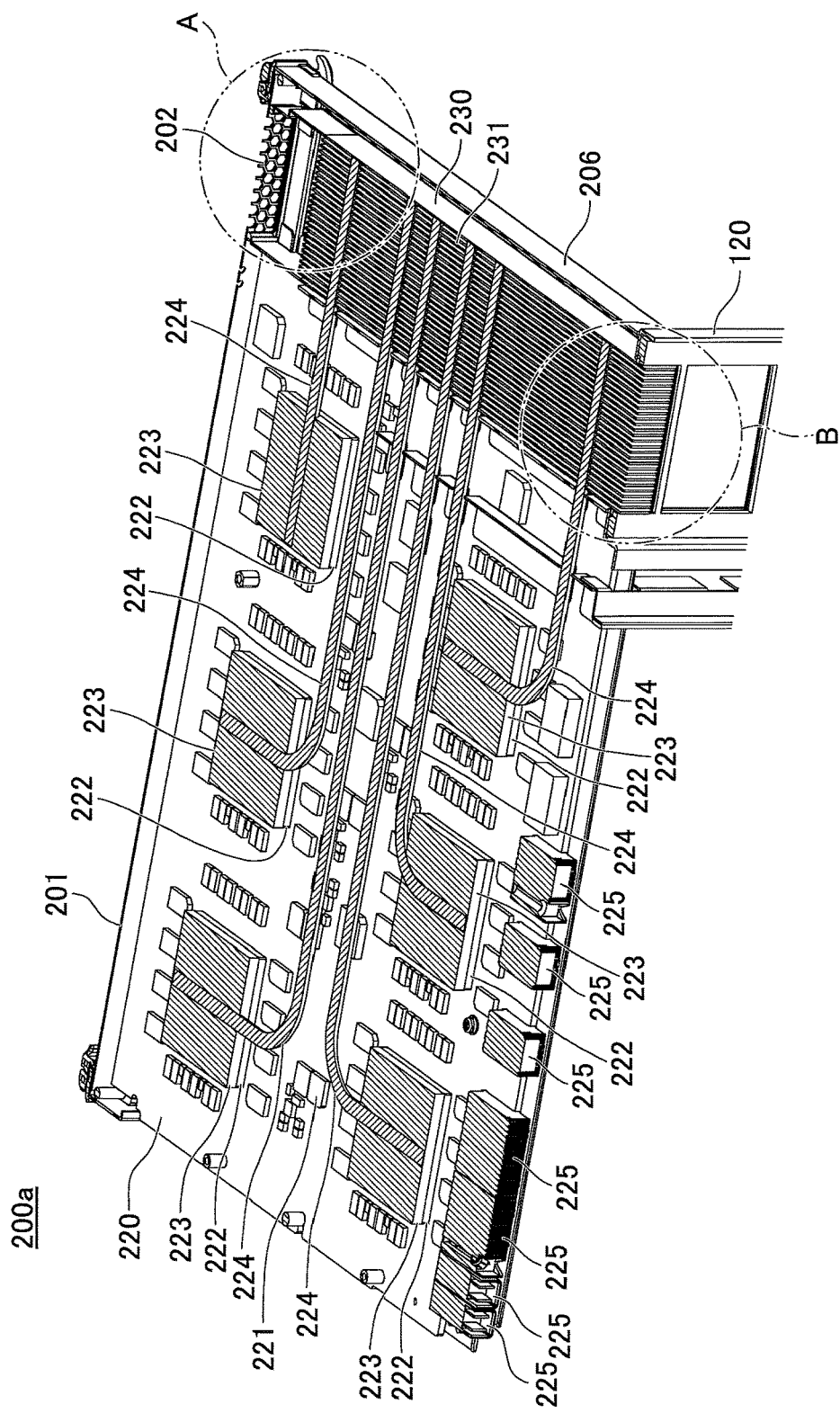
FIG. 6 is a perspective view of a cross-section with a heat pipe of the plugin unit run across, in the first embodiment.

FIG. 6 is a perspective view of a cross-section with the heat pipe 224 of the plugin unit 200a run across, in the first embodiment.

As described in FIG. 6, one edge of the heat pipe 224 penetrates the heat receiving member 223, and another edge thereof penetrates the radiator 230 from the side surface. In the radiator 230, along a direction of an airflow toward the first fan unit 131, which is not illustrated in FIG. 6, from the air supply cover 202 of the front panel 201, a plurality of fins 231 are arranged. The fins 231 diffuse the heat transferred by the heat pipe 224, and improve a heat dissipation efficiency.

Figure 7:
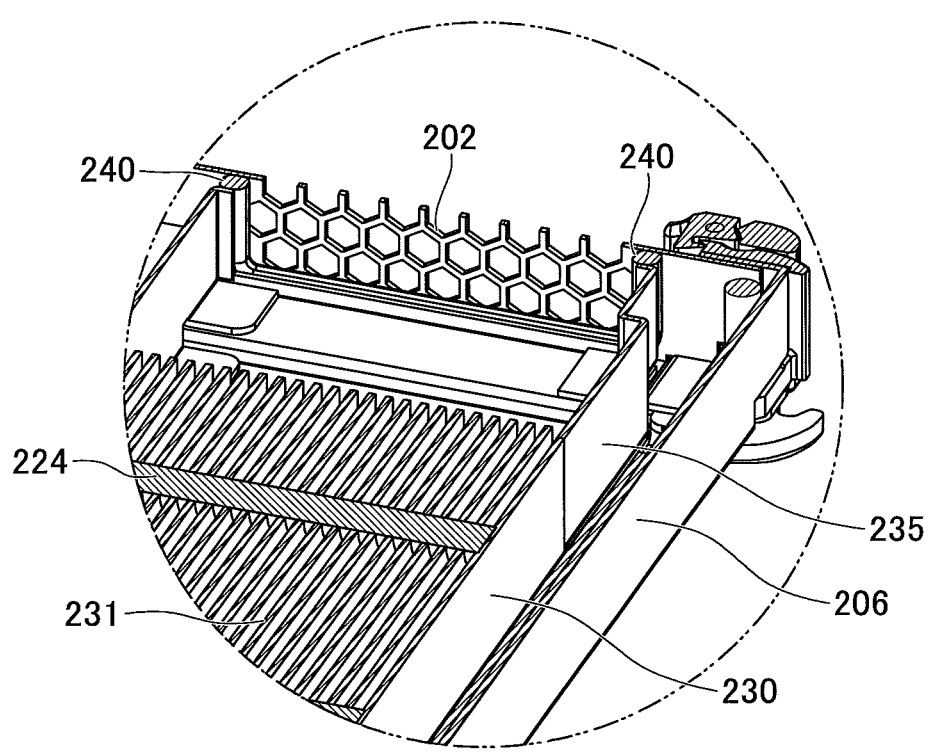
FIG. 7 is an enlarged view of a portion "A" in FIG. 6.

FIG. 7 is an enlarged view of a portion "A" in FIG. 6. Also, FIG. 8 is an exploded view illustrating a front side configuration of the radiator 230 in the first embodiment.

Figure 8:
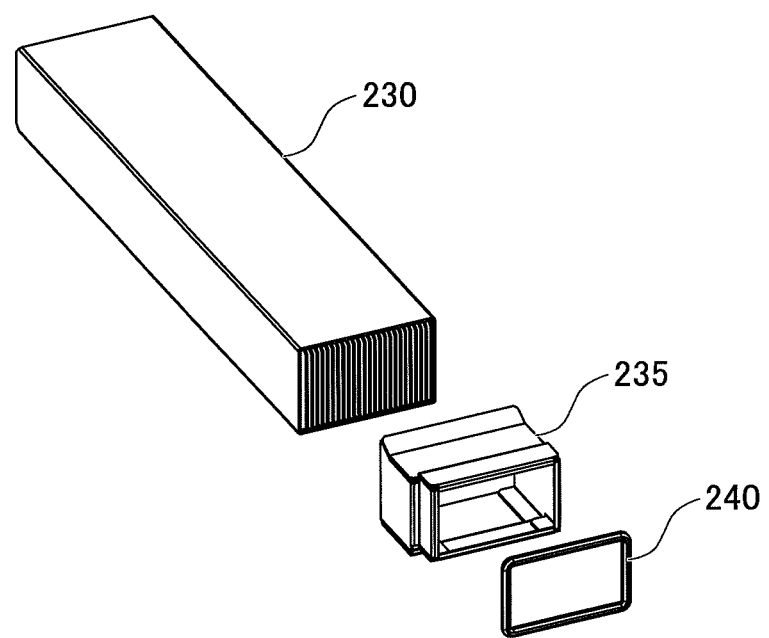
FIG. 8 is an exploded view illustrating a front side configuration of a radiator in the first embodiment.

As depicted in FIG. 7 and FIG. 8, an adaptor 235 and a front seal member 240 are attached to a front side of the radiator 230.

The adaptor 235 is formed in a tubular shape, and is coupled to the front panel 201 side of the radiator 230. The adaptor 235 leads the air flowed from the air supply cover 202 of the front panel 201 to an inside of the radiator 230.

The front seal member 240 may be an annular member formed by the elastic material such as rubber or the like, and is attached to an edge of the adaptor 235 at the side of the front panel 201. The front seal member 240 seals between the front panel 201 and the adaptor 235 around the air supply cover 202. Also, the front seal member 240 functions as a buffer material, and absorbs shock and vibration, dimensional tolerance of each component, and the like between the front panel 201 and the adaptor 235 by elastically deforming.

Figure 9:
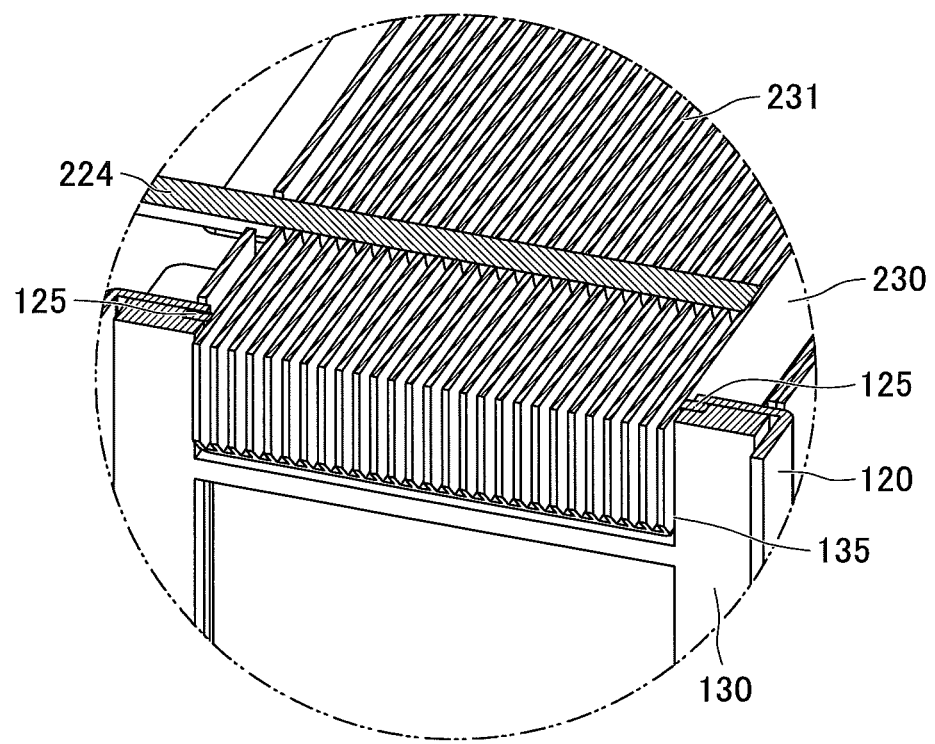
FIG. 9 is an enlarged view of a portion "B" in FIG. 6.

FIG. 9 is an enlarged view of a portion "B" in FIG. 6. Also, FIG. 10 is an exploded view illustrating a back side configuration of the radiator 230 in the first embodiment.

Figure 10:
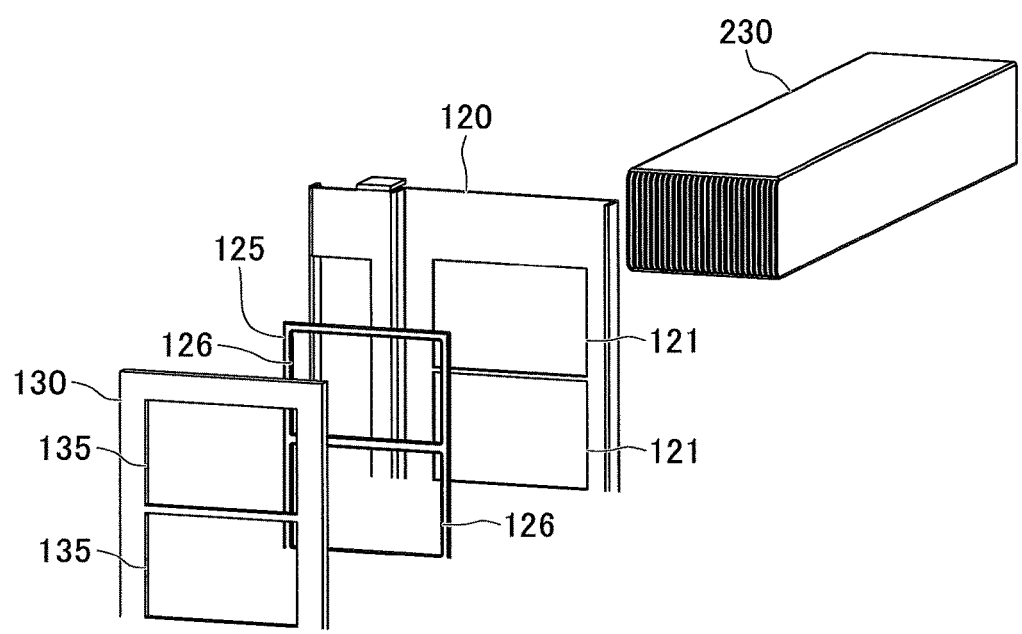
FIG. 10 is an exploded view illustrating a back side configuration of the radiator in the first embodiment.

As illustrated in FIG. 10, on the inner plate 120 of the chassis 100, an opening 121 is formed to insert an edge of the back side of the radiator 230. Moreover, a fixing plate 130 is fixed to the inner plate 120 so as to sandwich a back seal member 125 between the fixing plate 130 and the inner plate 120.

An opening 135, which has the same size as the opening 121 of the inner plate 120, is formed on the fixing plate 130. The fixing plate 130 is fixed on the inner plate 120 so as to sandwich the back seal member 125 between the inner plate 120 and the fixing plate 130, such that the opening 121 corresponds to the opening 135.

The back seal member 125 is regarded as a sheet member preferably formed by elastic material such as rubber of the like, and an opening 126 is formed on the back seal member 125 to insert the edge of the back side of the radiator 230. An inner periphery of the opening 126 of the back seal member 125 contacts a peripheral surface of the radiator 230, which is inserted into the opening 121 of the inner plate 120. The back seal member 125 seals between the opening 121 of the inner plate 120 and the circumference of the radiator 230. Moreover, the back seal member 125 functions as the buffer material. In addition to absorbing the dimensional tolerance of each component, the back seal member 125 absorbs the shock, the vibration, and the like in a case of inserting the radiator 230 into the opening 121 of the inner plate 120 and in an insertion state.

As described above, by sealing between the front panel 201 and the adaptor 235 by the front seal member 240, the air is flowed into the radiator 230 from the front panel 201 without leaking. Moreover, by sealing between the opening 121 of the inner plate 120 and the radiator 230 by the back seal member 125, the air is forcibly flowed with respect to the radiator 230 by the first fan unit 131 and the second fan unit 132. As a result, a flow rate of the air flowing into the radiator 230 from the air supply cover 202 is increased. Hence, the heat dissipation efficiency of the radiator 230 is improved.

It is noted that the front seal member 240 may be provided on the front panel 201. Moreover, instead of the back seal member 125, an annular member formed by elastic material such as rubber or the like may be arranged at the edges of the back side of the radiator 230, and may seal between the peripheral surface of the radiator 230 and the opening 121 of the inner plate 120.

The radiator 230 is enabled to support variation with respect to the substrate 220, away from the substrate 220 in a state of being free from the lower cover 206 or in a state of being supported therefrom, by the heat receiving member 223 fixed to the electronic component 222 and the heat pipe 224 of which one edge is fixed by the heat receiving member 223.

The plugin unit 200a is inserted into the slot of the chassis 100, the connector 225 of the substrate 220 is connected to a connector of the back wiring board 110, and the radiator 230 is inserted into the opening 121 of the inner plate 120, so that the plugin unit 200a is mounted in the chassis 100.

When the plugin unit 200a is mounted to the chassis 100, the radiator 230 supported for variation is displaced to correspond to a location of the opening 121 of the inner plate 120. By displacing to correspond to the location of the opening 121 of the radiator 230, the plugin unit 200a absorbs a dimensional freedom for mounting to the chassis 100 and the dimensional tolerance of each component. Accordingly, in a state in which the plugin unit 200a is mounted in the chassis 100, stresses applied to the connector 225 of the substrate 220, the connector of the back wiring board 110, and the like are reduced.

In addition, by elastically deforming the back seal member 125, similarly, the plugin unit 200a absorbs the dimensional freedom for mounting to the chassis 100 and the dimensional tolerance of each component. Hence, the stresses applied to the connector 225 of the substrate 220, the connector of the back wiring board 110, and the like are reduced.

As described above, in the electronic device 10 in the first embodiment, due to the displacement of the radiator 230 and the elastic deformation of the back seal member 125, the stresses applied to the connector 225 of the substrate 220, the connector of the back wiring board 110, and the like are reduced. Accordingly, it is possible to reduce possibility of damages of the connector 225 of the substrate 220, the connector of the back wiring board 110, and the like.

Figure 11:
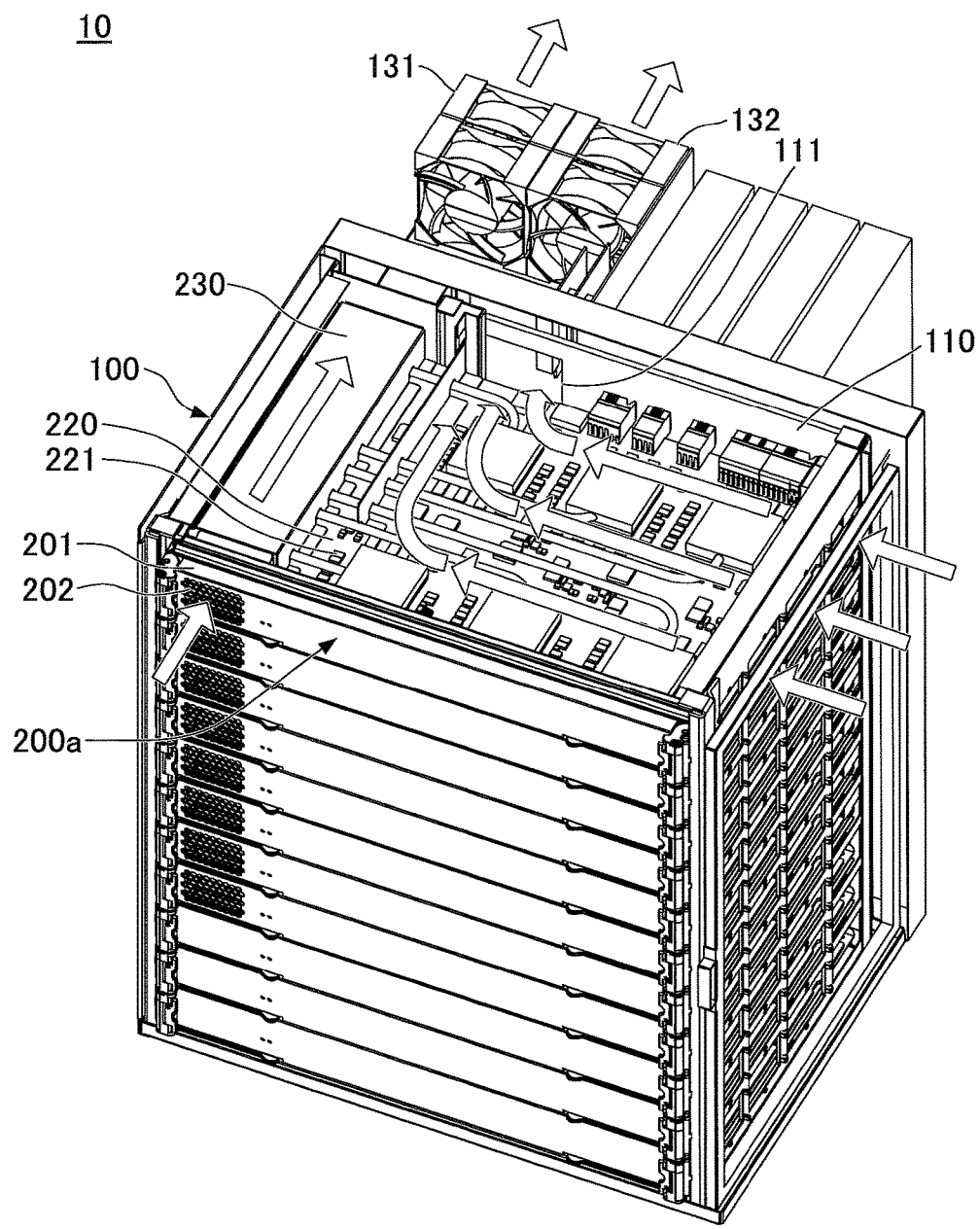
FIG. 11 is a diagram illustrating the flow of the air in the electronic device in the first embodiment.

FIG. 11 is a diagram illustrating the flow of the air in the electronic device 10 in the first embodiment. When the first fan unit 131 and the second fan unit 132 mounted in the chassis 100 are driven, as illustrated by outlined arrows in FIG. 11, the flow of the air passing inside the plugin unit 200a is formed.

When the first fan unit 131 and the second fan unit 132 mounted in the chassis 100 are driven, the air is flowed inside the radiator 230 from the air supply cover 202 of the front panel 201 of the plugin unit 200a. The air flowed into the radiator 230 is exhausted to the back side of the first fan unit 131 and the second fan unit 132 through the radiator 230.

As described above, since the air is flowed into the radiator 230 by the first fan unit 131 and the second fan unit 132, the heat of the electronic component 222 is lead to the radiator 230 through the heat receiving member 223 and the heat pipe 224 and is released. Hence, the electronic component 222 is cooled.

Moreover, when the first fan unit 131 and the second fan unit 132 are driven, the air is flowed into the inside of the chassis 100 from the inlets 104 arranged on the side plate 102 of the chassis 100. The air, which is flowed into the inside of the chassis 100, flows into both an upper surface side and a lower surface side of the substrate 220 through the side guide 204 of the plugin unit 200a. On both the upper surface side and the lower surface side of the substrate 220, the plurality of the electronic components 221 are mounted.

The air, which is flowed in to inside the plugin unit 200a, passes the ventilation opening 111 arranged on the back wiring board 110 of the chassis 100, and is exhausted at the back sides of the first fan unit 131 and the second fan unit 132. By generating the air-current by forming the flow of the air on component mounting surfaces of the substrate 220 by the first fan unit 131 and the second fan unit 132, the plurality of the electronic components 221 mounting on the substrate 220 are cooled.

As described above, most of the heat, which is generated by the electronic component 222 having the high heat release value, is lead to the radiator 230 by the heat receiving member 223 and the heat pipe 224 and is dissipated by the radiator 230. Accordingly, it is possible to cool a plurality of the electronic components 221 by the air flowing on the component mounting surfaces of the substrate 220, even for a plurality of the electronic components 221 mounted under an air-current of the electronic component 222 having the high heat release value.

As described above, in the electronic device 10 in the first embodiment, by the first fan unit 131 and the second fan unit 132, the air is flowed through the radiator 230, and also the air flows on the component mounting surfaces of the substrate 220. Thus, the air-current is generated. Since the heat of the electronic component 222 having the high heat release value is dissipated by the radiator 230, a thermal influence from the electronic component 222 is reduced. Hence, in addition to the electronic component 222, it is possible to cool the plurality of the electronic components 221 mounted under the air-current of the electronic component 222. Accordingly, it is possible to effectively cool the plurality of the electronic components 221 and the electronic component 222, which are mounted on the substrate 220 and have a differing heat release value.

Figure 12:
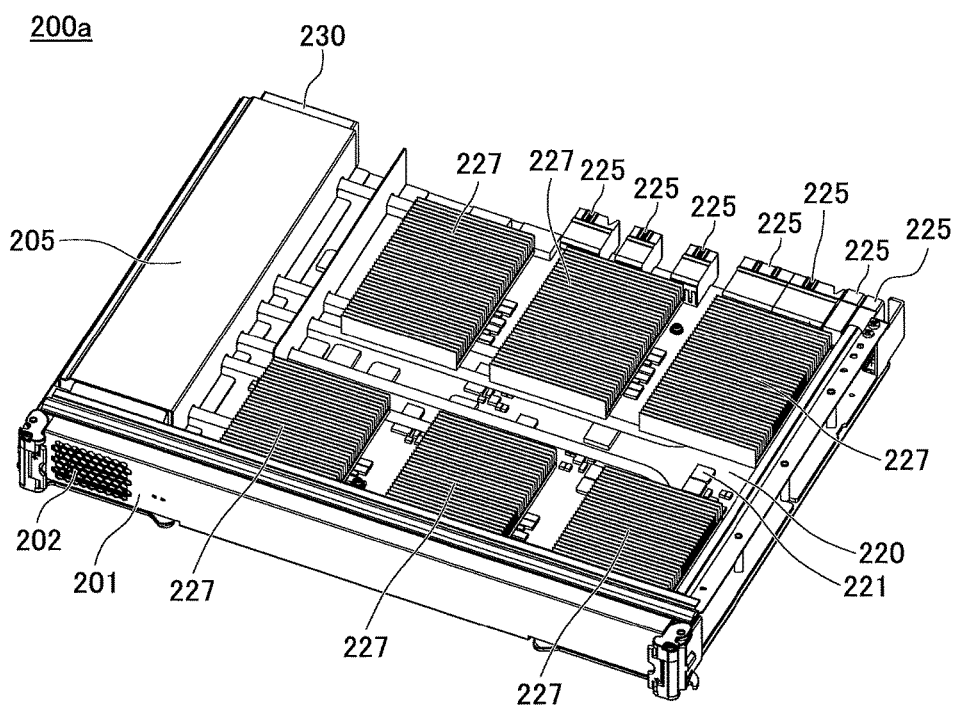
FIG. 12 is a diagram illustrating a configuration in which a heat sink is provided in the plugin unit in the first embodiment.

It is noted that a heat radiation member for radiating the heat generated in the electronic component 222 may be provided on a top surface of the heat receiving member 223. In the plugin unit 200a illustrated in FIG. 12, a heat sink 227 is provided as the heat radiation member on the heat receiving member 223. By dissipating the heat of the electronic component 222 by both the heat sink 227 and the radiator 230, it is possible to further effectively cool the plurality of the electronic components 221 and the electronic component 222, which are mounted on the substrate 220.

Figure 13:
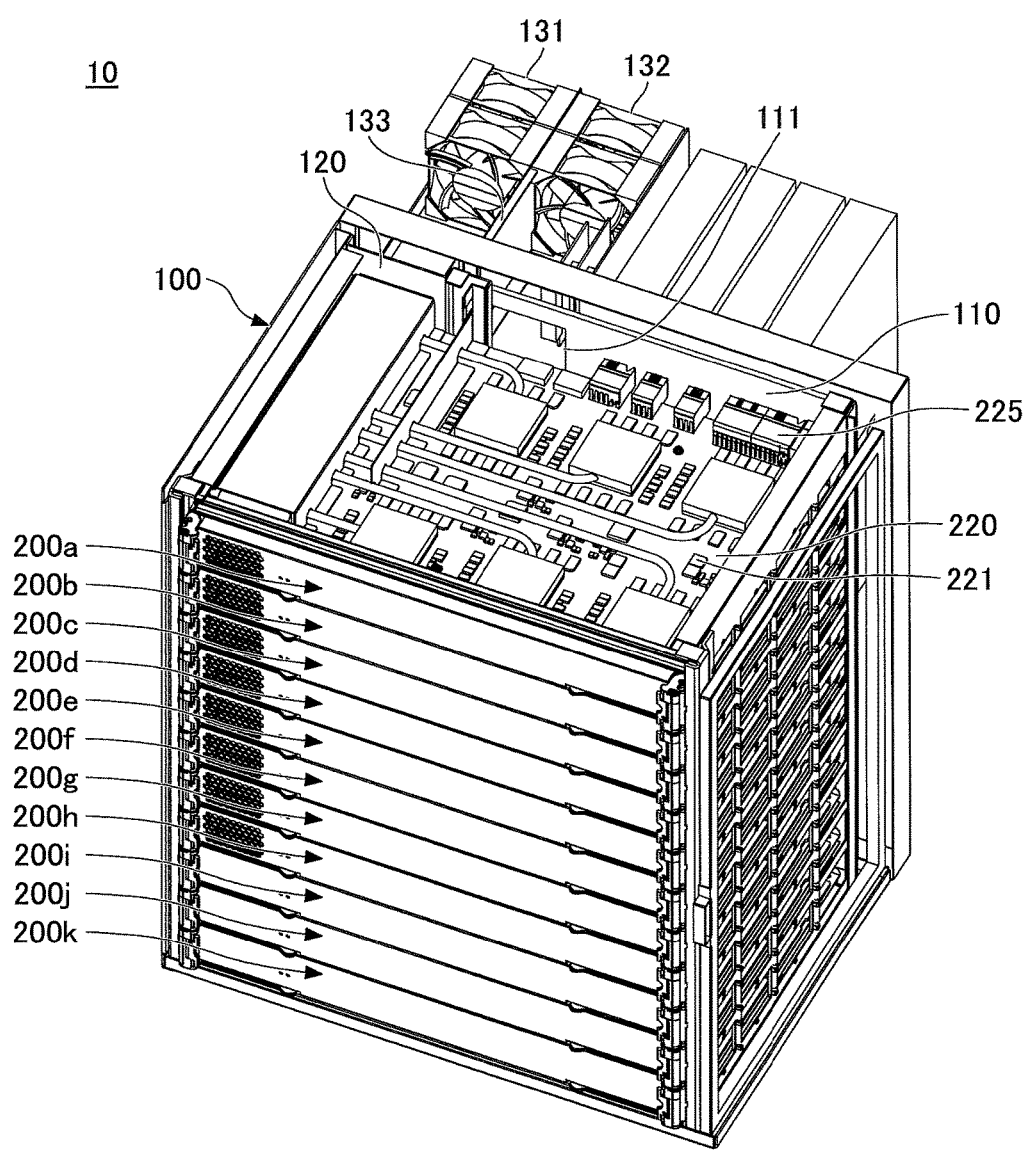
FIG. 13 is a diagram illustrating the electronic device where a partition plate is provided.
Figure 14:
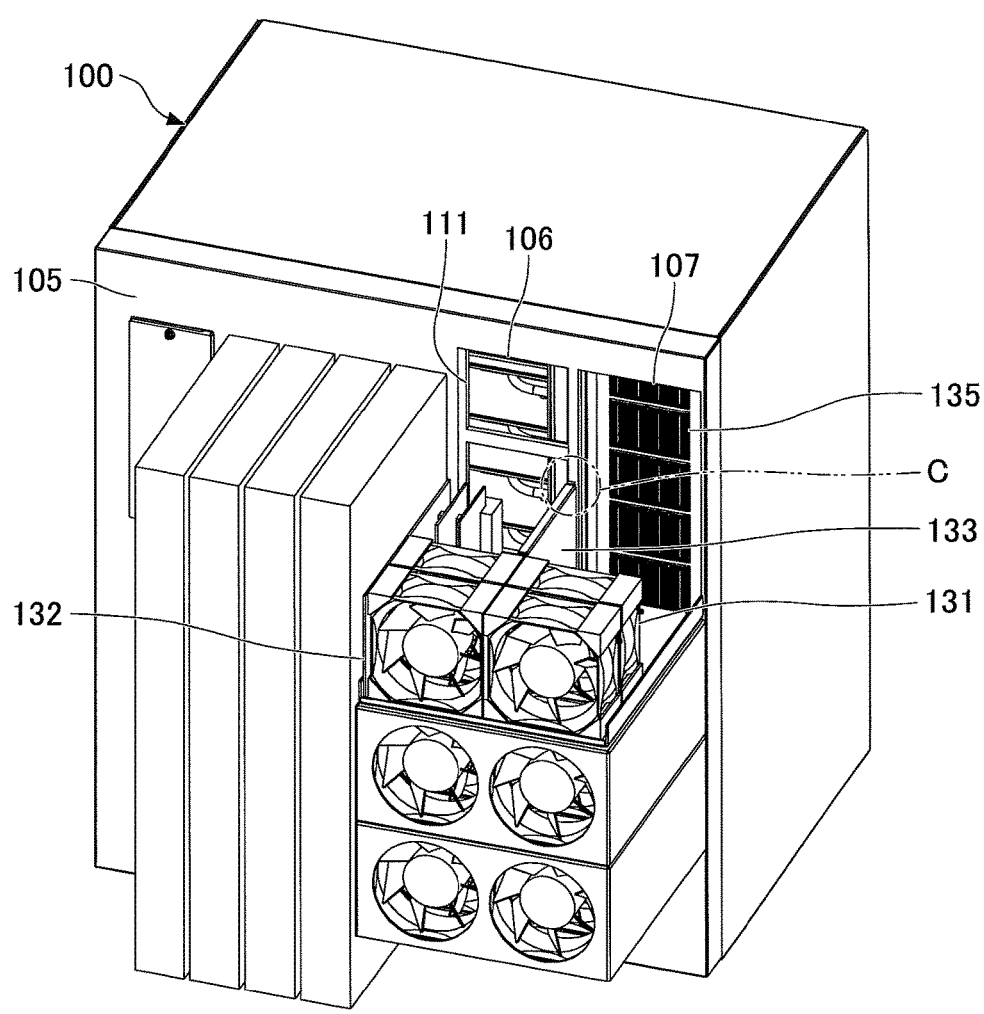
FIG. 14 is a perspective view from the back side of the electronic device 10 mounting the partition plate.

Moreover, as illustrated in FIG. 13, a partition plate 133 may be provided between the first fan unit 131 and the second fan unit 132. FIG. 13 is a diagram illustrating the electronic device 10 mounting the partition plate 133 between the first fan unit 131 and the second fan unit 132. In addition, FIG. 14 is a perspective view from the back side of the electronic device 10 mounting the partition plate 133. In FIG. 14, a state is depicted in which the first fan unit 131 and the second fan unit 132 are removed at a top row, and the first fan unit 131 and the second fan unit 132 are further removed at a second row from the top row.

As depicted in FIG. 14, on a backboard 105 of the chassis 100, a first opening 106 and a second opening 107 are formed. The first opening 106 opens to the ventilation opening 111 of the back wiring board 110, and the second opening 107 opens to the radiator 230 to be inserted into the opening 135 of the fixing plate 130.

The partition plate 133 is provided so as to extend, from between the first fan unit 131 and the second fan unit 132, towards between the first opening 106 and the second opening 107 of the back plate 105.

Figure 15:
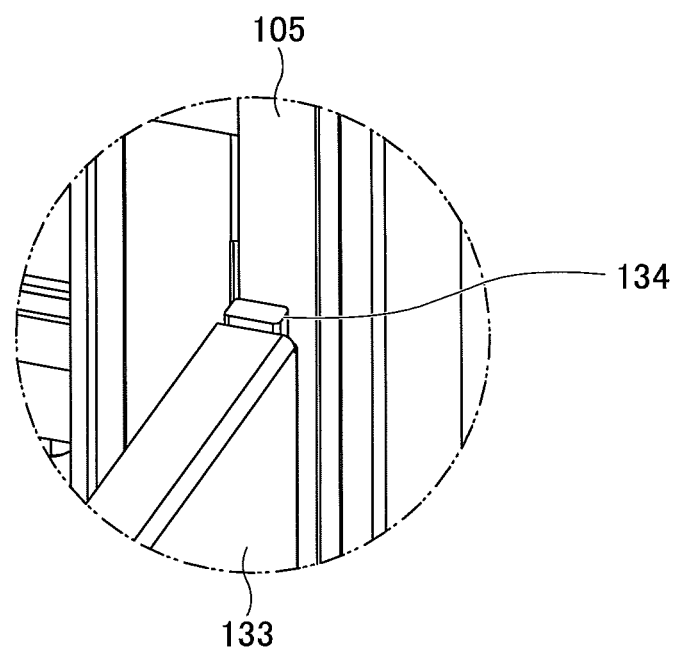
FIG. 15 is an enlarged view of a portion "C" in FIG. 14.

FIG. 15 is an enlarged view of a portion "C" in FIG. 14. As illustrated in FIG. 15, a gasket 134 is provided as a partition seal member between the partition plate 133 and the backboard 105 of the chassis 100. The gasket 134 seals between the partition plate 133 and the backboard 105.

By the partition plate 133 and the gasket 134, a flow route of the air passing the radiator 230 is separated from a flow route of the air passing the component mounting faces of the substrate 220. Thus, air tightness of each of the distribution routes is enhanced. Rather than a case of simply forming the flow of the air to be separate flow routes for both the first fan unit 131 and the second fan unit 132, the flow of the air in each of the distribution routes can be stabilized to enable more effective cooling of the electronic component 222 mounted on the substrate 220.

Figure 16:
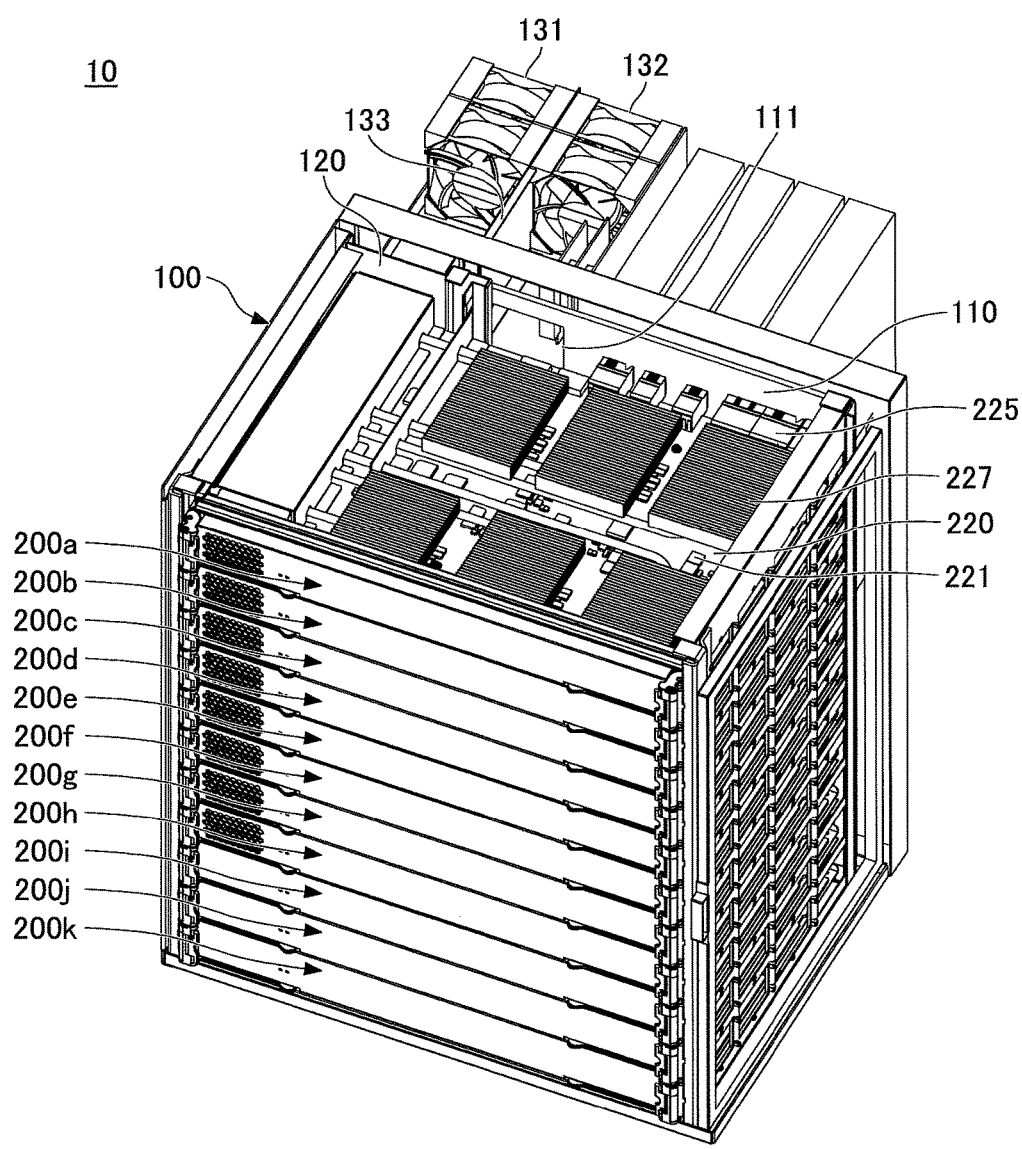
FIG. 16 is a diagram illustrating a state in which the plugin unit mounting the heat sink is mounted in the electronic device mounting the partition plate.

Moreover, as illustrated in FIG. 16, also, in a case in which the heat sink 227 is provided in the plugin unit 200a, similarly, it is possible to improve cooling efficiency of the electronic component 222 mounted on the substrate 220 by providing the partition plate 133. It is noted that in this case also, it is preferable to provide the gasket 134 to enhance the air tightness for each of the distribution routes.

The plugin unit 200a has been described with the above illustrated examples. Each of the plugin units 200b to 200h mounted on the electronic device 10 includes the same configuration as that of the plugin unit 200a. That is, each of the plugin units 200b to 200h includes a substrate where a plurality of electronic components having different heat release values, a radiator similar to that of the plugin unit 200a, and a heat receiving member and a heat pipe transferring the heat of an electronic device having the high heat release value. In each of the plugin units 200b to 200h, by the first fan unit 131 and the second fan unit 132, the air flows so as to pass through the radiator, and also, the air flows on the component mounting surfaces of the substrate. Hence, the plurality of the electronic components mounted on the substrate are cooled.

Meanwhile, the plugin units 200i to 200k, in which the radiator is not provided, may be mounted in the electronic device 10, since there is no electronic component having the high heat release value. For the plugin units 200i to 200k, in which the radiator is not provided, a member may be provided to close the opening 121 of the inner plate 120 of the chassis 100. In each of the plugin units 200i to 200k, the air flows on the component mounting surfaces of the substrate by the first fan unit 131 and the second fan unit 132, and the plurality of the electronic components are cooled.

Second Embodiment

Next, a second embodiment will be described with reference to the accompanying drawings. It is noted that explanation of components that are the same as those in the first embodiment will be omitted.

Figure 17:
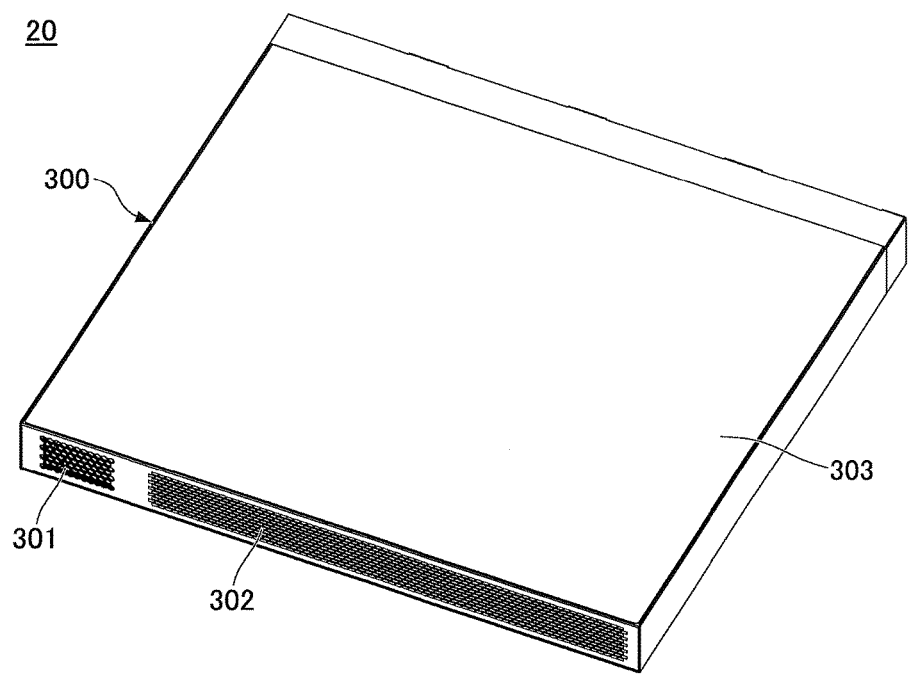
FIG. 17 is a perspective view of an electronic device in a second embodiment.
Figure 18:
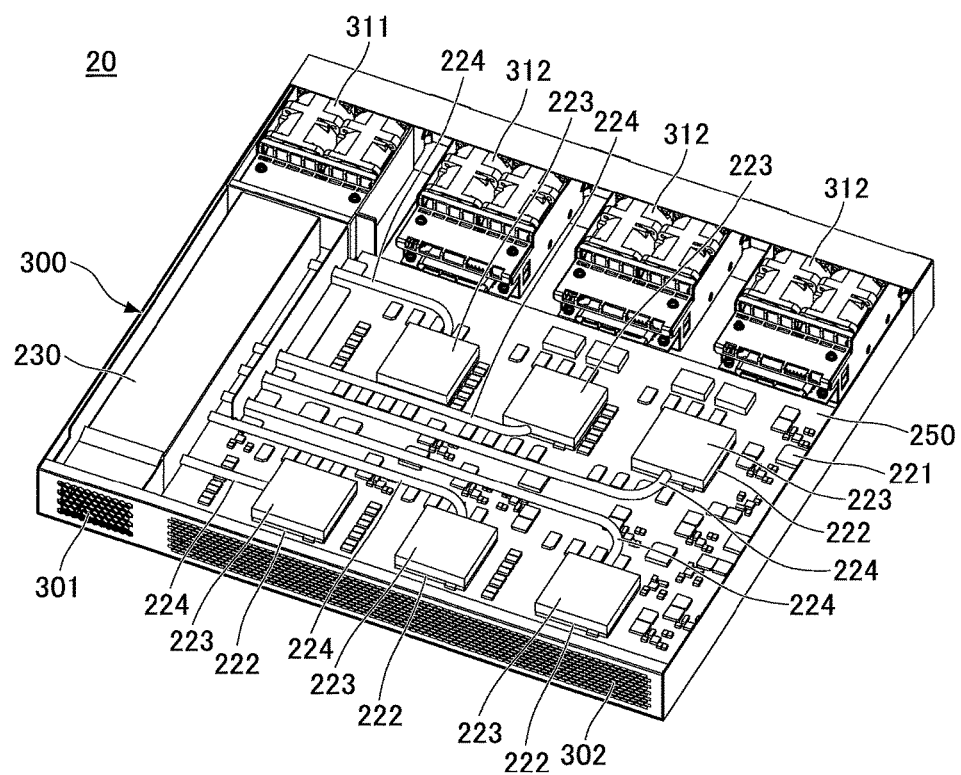
FIG. 18 is a perspective view of the electronic device, of which the top board of the chassis depicted in FIG. 17 is removed.

FIG. 17 is a perspective view of an electronic device 20 in the second embodiment. FIG. 18 is a perspective view of the electronic device 20, of which a top board 303 of a chassis 300 depicted in FIG. 17 is removed.

In the electronic device 20, a radiator 230, a substrate 250, a first fan unit 311, and a second fan unit 312 are mounted in the chassis 300.

The substrate 250 mounts the plurality of the electronic components 221 and is fixed on a bottom board of the chassis 300. The electronic component 222, which consumes power more than other electronic components 221 and has the high heat release value, is mounted on the substrate 250.

The heat receiving member 223 is provided on a top surface of the electronic component 222 having the high heat release value. One end of the heat pipe 224 is coupled to the heat receiving member 223, and another end of the heat pipe 224 is coupled to the radiator 230. The heat pipe 224 transfers the heat, which the heat receiving member 223 receives from the electronic component 222, to the radiator 230.

The radiator 230 dissipates the heat of the electronic component 222 transferred by the heat receiving member 223 and the heat pipe 224, outside the electronic device 20 by the air passing through the inside of the electronic device 20.

The first fan unit 311 and the second fan unit 312 are provided at the back side of the chassis 300. When the first fan unit 311 and the second fan unit 312 are driven, the air flows from a first inlet 301 and a second inlet 302 provided in front of the chassis 300 toward an inside of the chassis 300. The air flowed into the chassis 300 is exhausted to an outside of the chassis 300 from the first fan unit 311 and the second fan unit 312.

Figure 19:
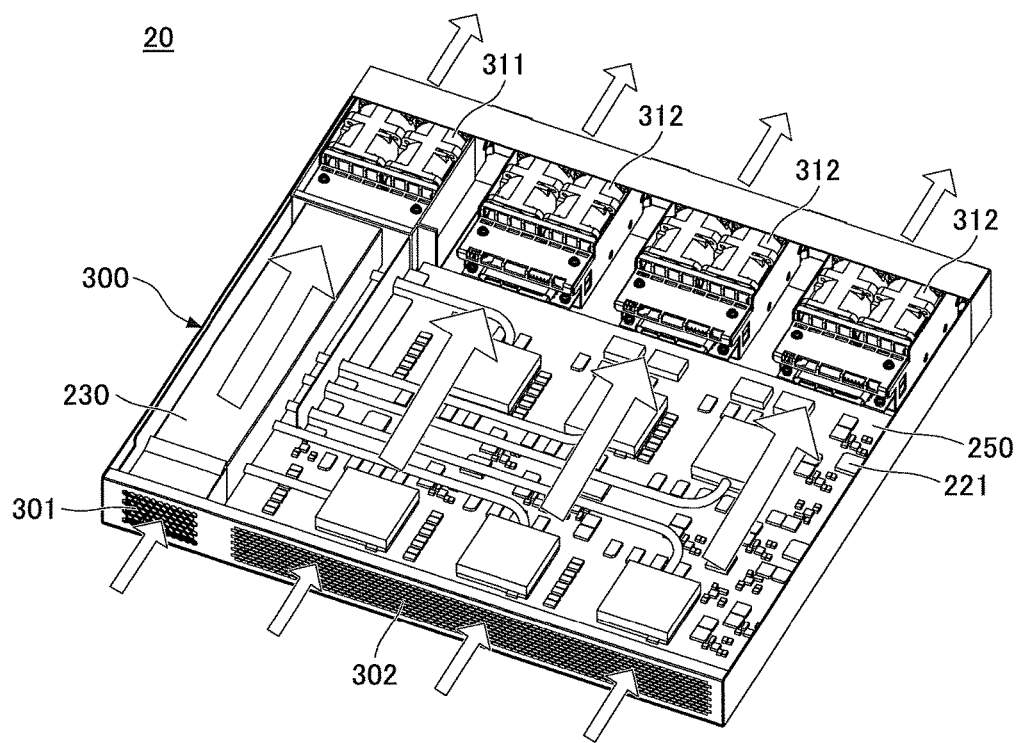
FIG. 19 is a diagram illustrating an airflow path in the second embodiment.

FIG. 19 is a diagram illustrating an airflow path in the second embodiment. As the first fan unit 311 and the second fan unit 312, which are mounted on the chassis 300, are driven, the air flows on or in the radiator 230 and the component mounting surfaces of the substrate 250 as illustrated by outlined arrows in FIG. 19.

When the first fan unit 311 is driven, the air flows from the first inlet 301 of the chassis 300 into an inside of the radiator 230. The air, which flows into the radiator 230, passes through the radiator 230 and is exhausted to the back side of the chassis 300 from the first fan unit 311.

As described above, since the air is flowed to the radiator 230, the heat of the electronic component 222, which is lead to the radiator 230 through the heat receiving member 223 and the heat pipe 224, is dissipated. Hence, the electronic component 222 is cooled.

Moreover, when the second fan unit 312 is driven, the air flows from the second inlet 302 of the chassis 300 onto the component mounting surfaces of the substrate 250. The air flowed from the second inlet 302 of the chassis 300 passes both component mounting surfaces, that is, an upper surface side and an lower surface side of the substrate 250 both on which the plurality of the electronic components 221 are mounted, and is exhausted to the back side of the chassis 300 from the second fan unit 312. As described above, by the air flowing on the component mounting surfaces of the substrate 250, the plurality of the electronic components 221 mounted on the substrate 250 are cooled.

As described above, since the heat of the electronic component 222 is dissipated by the radiator 230, a thermal influence from the electronic component 222 is reduced. Accordingly, even if the electronic components 221 are mounted under an air-current of the electronic component 222 having the high heat release value, it is possible to cool the electronic components 221 by the air flowing on the component mounting surfaces of the substrate 250.

As described above, in the electronic device 20 in the second embodiment, by means of the first fan unit 311 and the second fan unit 312, the air-current is generated by the air flowing in the radiator 230 and on the component mounting surfaces of the substrate 250. The heat of the electronic component 222 having the high heat release value is dissipated by the radiator 230. Hence, it is also possible to cool the plurality of the electronic components 221 mounted under the air-current of the electronic component 222. Accordingly, it is possible to effectively cool the plurality of electronic components (that is, the electronic components 221 and the electronic component 222), which are mounted on the substrate 250 and have the differing heat release values.

Figure 20:
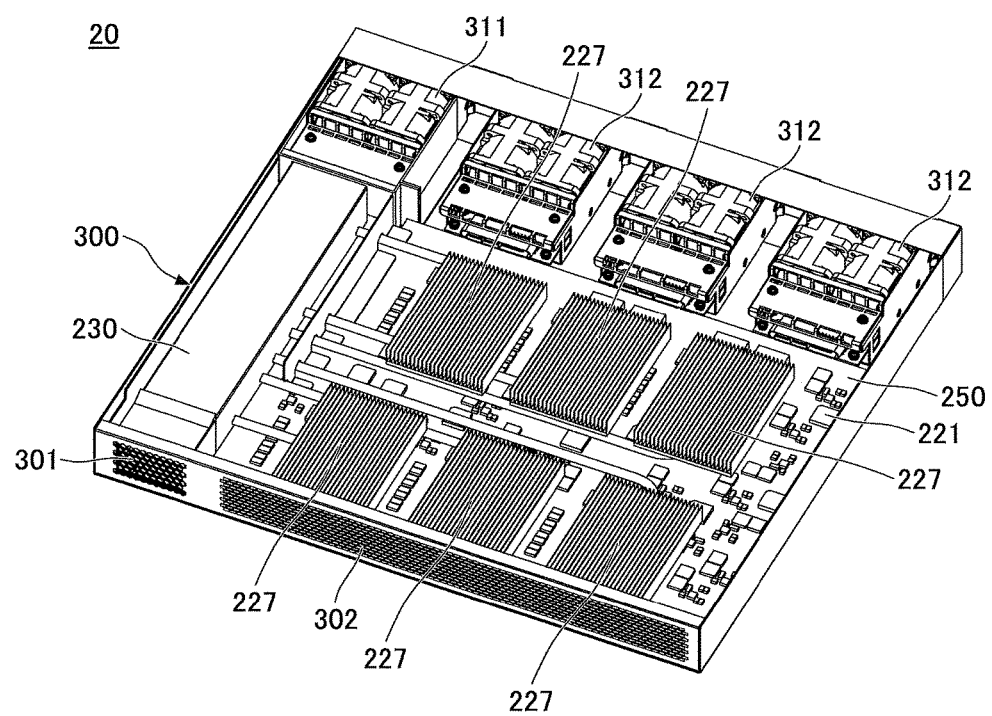
FIG. 20 is a diagram illustrating a configuration in which the heat sink is provided in the electronic device in the second embodiment.

It is noted that a heat radiation member may be provided to dissipate the heat generated by the electronic component 222 on a top surface of the heat receiving member 223. In the electronic device 20 illustrated in FIG. 20, the heat sink 227 is provided as the heat radiation member on the top surface of the heat receiving member 223. Since both the heat sink 227 and the radiator 230 dissipate the heat of the electronic component 222, it is possible to further effectively cool the electronic components 221 and the electronic component 222 mounted on the substrate 220.

According to the first embodiment and the second embodiment, it is possible to provide an electronic device capable of effectively cooling a plurality of electronic components having different heat release values.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
a chassis; and
at least one plugin unit mounted in the chassis,
wherein the plugin unit includes
a substrate that mounts a first electronic component and a second electronic component having a higher heat release value than the first electronic component;
a heat receiving member that receives heat by contacting the second electronic component;
a radiator that is shaped as a duct; and
a heat transfer member that transfers the heat from the heat receiving member to the radiator, and
wherein the chassis includes
a fan that generates air-current inside the radiator and on one or more component mounting surfaces of the substrate,
wherein the fan generates a first air-current that is flowed inside the radiator from a front panel of the plugin unit and generates a second air-current that is flowed in the chassis from a side plate of the chassis.

2. The electronic device as claimed in claim 1, wherein the plugin unit includes
a heat radiation member that dissipates the heat, which the heat receiving member receives from the second electronic component.

3. The electronic device as claimed in claim 1,
wherein the chassis includes
a back wiring board, to which a connector provided on the substrate is connected; and
an inner plate, on which an opening is formed to insert the radiator, and
wherein a seal member is provided to seal a space between the radiator and the opening in one of the radiator and the inner plate; and
the radiator is enabled to support variation with respect to the substrate by the heat transfer member.

4. The electronic device as claimed in claim 3, wherein the seal member is formed by an elastic material.

5. The electronic device as claimed in claim 1, wherein a plurality of fins are formed in the radiator to diffuse the heat transferred from the heat transfer member.

6. The electronic device as claimed in claim 1, wherein the heat transfer member is a heat pipe.

7. The electronic device as claimed in claim 1, further comprising:
an adaptor that is shaped as a sleeve and leads air flowed from an inlet provided in the chassis to the radiator; and
a seal member that covers a perimeter of the inlet and seals between the chassis and the adapter.

8. The electronic device as claimed in claim 7, wherein the seal member is formed by an elastic material.

9. The electronic device as claimed in claim 1, wherein the fan includes
a first fan that generates air-current inside the radiator; and
a second fan that generates air-current on the one or more component mounting surfaces of the substrate,
wherein between the first fan and the second fan, a partition member is provided to partition a first airflow by the first fan and a second airflow by the second fan, and a partition seal member is provided to seal between the partition member and the chassis.

10. An electronic device comprising:
a substrate that mounts a first electronic component and a second electronic component having a higher heat release value than the first electronic component;
a heat receiving member that receives heat by contacting the second electronic component;
a duct-shaped radiator;
a heat transfer member that transfers the heat from the heat receiving member to the radiator; and
a fan that transmits air-current inside the radiator and on one or more mounting surfaces of the substrate,
wherein the fan generates a first air-current that is flowed inside the radiator from a first inlet and generates a second air-current that is flowed in the chassis from a second inlet.

11. The electronic device as claimed in claim 10, wherein the heat receiving member includes a heat radiation member that radiates the heat, which the heat receiving member receives from the second electronic component.

* * * * *